United States Patent
Brummack et al.

(10) Patent No.: US 7,460,188 B2
(45) Date of Patent: Dec. 2, 2008

(54) SOLAR-POWERED DEVICE COMPRISING A SOLAR CELL ARRANGEMENT AND A LIQUID CRYSTAL DISPLAY AND METHOD OF MAKING

(75) Inventors: Hanna Brummack, Elzach (DE); Günter Megner, Uhldingen (DE)

(73) Assignee: Junghans Uhren GmbH, Schramberg (DE)

( * ) Notice: Subject to any disclaimer, the term of this patent is extended or adjusted under 35 U.S.C. 154(b) by 423 days.

(21) Appl. No.: 10/514,200

(22) PCT Filed: May 7, 2003

(86) PCT No.: PCT/EP03/04786

§ 371 (c)(1),
(2), (4) Date: Nov. 12, 2004

(87) PCT Pub. No.: WO03/096109

PCT Pub. Date: Nov. 20, 2003

(65) Prior Publication Data

US 2005/0225686 A1    Oct. 13, 2005

(30) Foreign Application Priority Data

May 14, 2002 (DE) ............................... 102 21 301

(51) Int. Cl.
*G02F 1/135* (2006.01)
*H01L 31/042* (2006.01)

(52) U.S. Cl. ................ 349/25; 349/1; 349/27; 349/56; 136/244

(58) Field of Classification Search ............ 349/25, 349/27
See application file for complete search history.

(56) References Cited

U.S. PATENT DOCUMENTS

| | | | | |
|---|---|---|---|---|
| 5,963,282 | A * | 10/1999 | Battersby | 349/86 |
| 5,990,995 | A * | 11/1999 | Ebihara et al. | 349/113 |
| 6,323,923 | B1 * | 11/2001 | Hoshino et al. | 349/113 |
| 7,206,044 | B2 * | 4/2007 | Li et al. | 349/113 |
| 2002/0027620 | A1 | 3/2002 | Platz et al. | |
| 2002/0109808 | A1 * | 8/2002 | Sekiguchi et al. | 349/96 |

FOREIGN PATENT DOCUMENTS

| | | |
|---|---|---|
| EP | 1 143 311 | 10/2001 |
| JP | 63-287827 | 11/1988 |
| JP | 08-094992 | 4/1996 |
| JP | 11-015396 | 1/1999 |
| JP | 11-031833 | 2/1999 |
| JP | 11-296636 | 10/1999 |
| JP | 2001-183616 | 7/2001 |

* cited by examiner

*Primary Examiner*—Andrew Schechter
*Assistant Examiner*—W. Patty Chen
(74) *Attorney, Agent, or Firm*—Buchanan Ingersoll & Rooney PC

(57) ABSTRACT

A solar-powered LCD device, e.g., for a clock, includes a solar cell arrangement and a liquid crystal display. The solar cell arrangement includes an at least partially transparent carrier and at least one solar cell provided with at least one at least partially transparent contact, at least one first polarizer, a first at least partially transparent carrier, a first at least partially transparent contact, a liquid crystal, a second transparent contact, a second transparent carrier, a second polarizer, and a reflector in a stacked arrangement. The carrier of the solar cell arrangement is one of the carriers of the liquid crystal display.

8 Claims, 2 Drawing Sheets

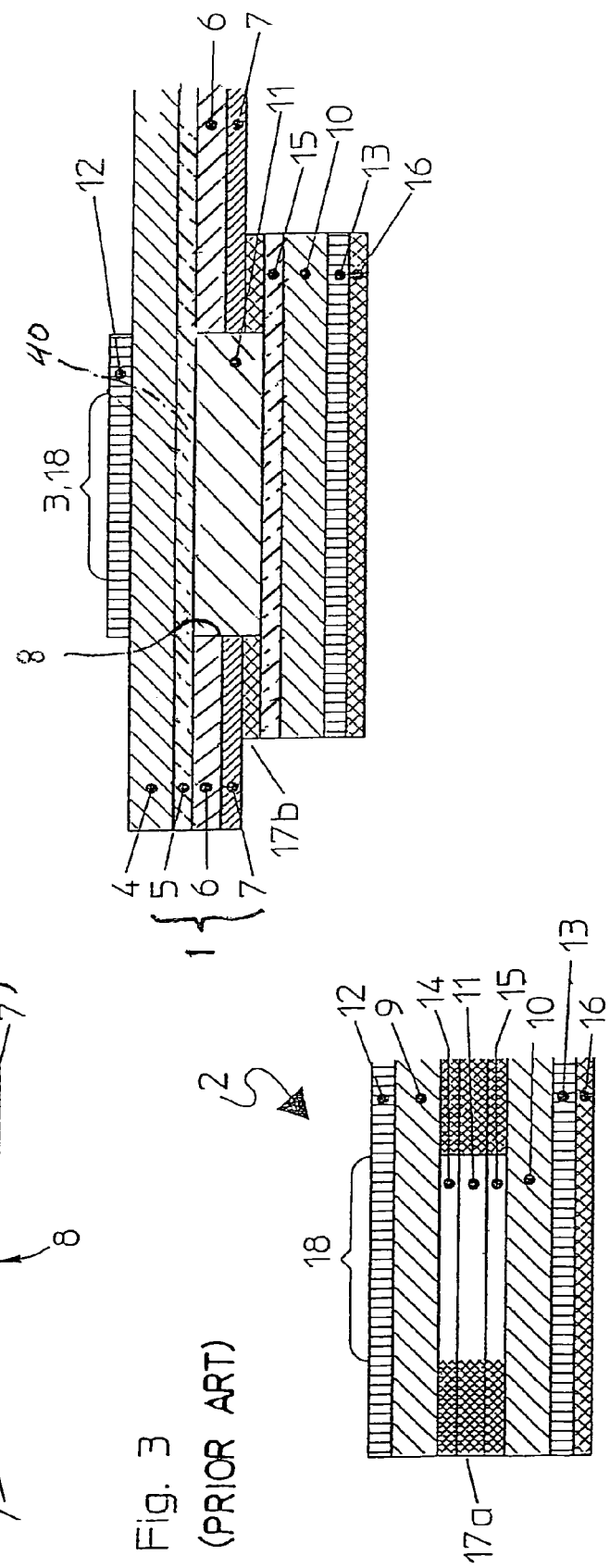
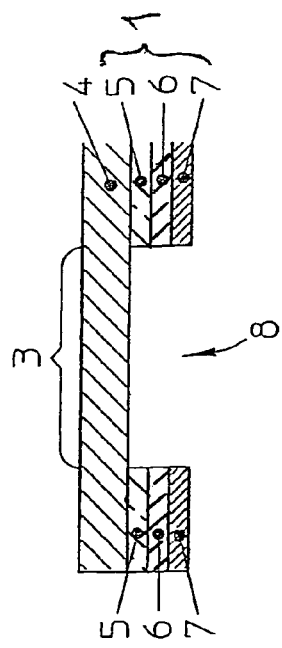

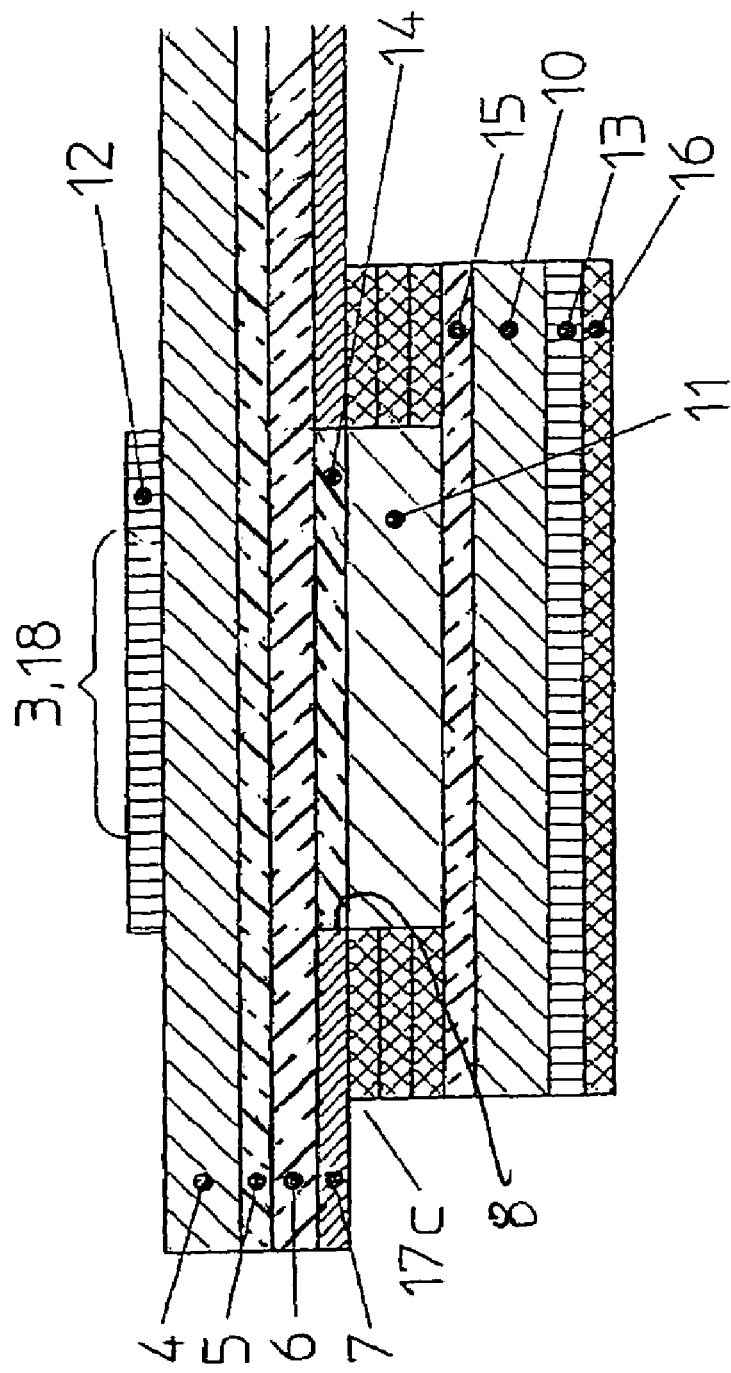

SOLAR-POWERED DEVICE COMPRISING A SOLAR CELL ARRANGEMENT AND A LIQUID CRYSTAL DISPLAY AND METHOD OF MAKING

BACKGROUND

The invention relates to a device comprising a solar cell arrangement and a liquid crystal display and a method for manufacturing such a device as well as a possibility of application.

Solar cell arrangements, namely single solar cells as well as arrangements—so-called modules made of several or a plurality of individual cells interconnected to each other—are known from prior art in a great number of modifications. Liquid crystal displays or so-called LCD's are also known in various embodiment versions. Solar arrangements and LCD's are commercially obtainable as separate components for different employment purposes.

It has also been known for some time to employ a solar cell arrangement as an energy source for a timepiece, especially a wristwatch. It is furthermore known to use liquid crystal displays to show the time of the day, the date or the like.

The majority of wristwatches are equipped with a dial train displaying time in an analog manner. For this purpose, the solar cell arrangement of a wristwatch of the aforementioned type serving as energy source is usually designed in the form of a dial face. An aforementioned LCD to show the date or other special functions is inserted into this dial face in many of these solar-powered wristwatches known as solar wristwatches. The solar dial faces and the LCD's are separate components in solar wristwatches of this type whereby said components are usually arranged being stacked on top of one another.

A "tunnel impression" in reading the LCD arranged behind a so-called data window is a disadvantage in such a stacked arrangement.

The invention has now the object to provide a device comprising a solar cell arrangement and an LCD making new display possibilities and effects possible in stacking the two optical elements, namely the solar cell arrangement and the LCD.

SUMMARY OF INVENTION

This object is achieved through a device comprising a solar cell arrangement and an LCD.

The invention is generally based on solar cell arrangements and LCD's of known types. Solar cell arrangements in the form of stacked arrangements are provided at least with one at least partially transparent carrier for one or several solar cells, which can be possibly interconnected to one or several modules. Each solar cell includes again at least one photovoltaically active layer embedded between one at least partially transparent contact and one metallic contact, as a rule.

Those skilled in the art are aware that the above-mentioned solar cell structure can include a plurality of such stacked arrangements disposed on top one another; so-called multi-junction arrangements are included as well, in particular.

Glass is usually used as carrier material of so-called thin-film solar cell arrangements, i.e. the ones in which the photovoltaically active layer is amorphous silicon. However, synthetic materials, ceramics or the like are also considered as carrier material.

In case of solar cell arrangements having crystalline materials as a photovoltaically active layer, such as crystalline silicon, for example, this crystalline material can take on the function of the carrier itself.

The LCD used in the invention is provided in its stacked arrangement with at least one first polarizer, an at least partially transparent carrier, a first contact being at least partially transparent, a liquid crystal, a second transparent contact, a second transparent carrier, a second polarizer and a reflector.

The main concept of the invention is to combine the solar cell arrangement and the LCD into one single component, which has had separate individual components up to now, and to combine them preferably in such a manner that the optical planes of the photovoltaically active layer and of the LCD are essentially in the same plane. This is realized according to the invention in that one carrier of the LCD serves as a carrier for the solar cell arrangement.

In principal, the LCD can be disposed below or above the solar cell arrangement or within an opening in the solar cell arrangement as well. The solar cell arrangement, or parts thereof, can thereby also assume functions of parts of the LCD (or vice versa) so that the total structural height is significantly reduced.

It is proposed in a first variant of the invention that the carrier of the solar cell arrangement is the first carrier of the LCD. The LCD lies in this case underneath the solar cell arrangement. In the simplest case, the solar cell arrangement and the LCD are arranged adjacent to each other but are laterally separated from one another. The solar cell arrangement and the LCD are in this case almost completely uncoupled. However, it is also possible that the solar cell arrangement and the LCD overlap each other laterally at least partially.

It is of advantage in the firstly mentioned embodiment version to use the transparent contact of the solar cell arrangement also as a first transparent contact of the LCD—or inversely, to use the first transparent contact of the LCD also as a first transparent contact of the solar cell arrangement in order to save space in structural height, on the one hand, and to keep as low as possible the number of processing steps in the manufacturing of such devices having a solar cell arrangement and an LCD, on the other hand.

It is of advantage for the second version, which is the at least partially overlapping arrangement of solar cell arrangement and LCD, to design the solar cell arrangement to be at least partially semi-transparent. The solar cell arrangement is preferably designed only in this overlapping area to be semi-transparent. Such overlapping offers new display possibilities and effects for the two optical elements.

BRIEF DESCRIPTION OF THE DRAWING

Two embodiment examples of the invention are illustrated in the drawings and they are described in more detail in the following:

FIG. 1 shows in cross section a first embodiment version of a solar dial face of a watch having an LCD arranged according to the invention.

FIG. 2 shows a basic design of a solar cell according to the state-of-the-art.

FIG. 3 shows a basic design of the LCD according to the state-of-the art.

FIG. 4 shows in cross section a second embodiment version of a solar dial face of a watch having an LCD arranged according to the invention.

DESCRIPTION OF PREFERRED EMBODIMENTS OF THE INVENTION

The first embodiment version of a solar dial face of a timepiece sketched in FIG. 1, particularly a wristwatch, is provided with a solar cell arrangement 1 as well as an LCD of generally known type. FIG. 2 and FIG. 3 show, respectively, the basic design of a conventional solar dial face 1A as well as of a conventional LCD 2 according to the state-of-the-art as they are currently employed.

The solar dial face is a single solar cell 1 in its structure in the present embodiment example. Those skilled in the art take it for granted that the solar dial face can also be formed by a plurality of such single cells, which can be interconnected in a corresponding manner (possibly directly on the substrate 4 as well.)

The conventional solar dial face 1A consists of a transparent carrier 4 made of glass onto which there are applied the transparent (front) contact 5 made of transparent conductive metal oxide (TCO=transparent conductive oxide), the photovoltaically active layer 6 made of amorphous silicon, and the (rear) contact 7 made of metal. The three layers consisting of a transparent contact 5, a photovoltaically active layer 6 and a contact 7 are removed forming an opening 8 in the area of the (data) window 3.

The conventional LCD 2 consists of an active liquid crystal 11, which maintains contact through two transparent carriers 9, 10, which are coated with TCO and glued to one another, two polarizers 12, 13 and one reflector 16. The dual TCO coatings representing the transparent contacts are identified in FIG. 2 with the reference numbers 14 and 15, and the adhesive bond is identified with the reference number 17a. It must be pointed out that the TCO layers having a structured texture (corresponding to the indicating numerals) are drawn as a smooth surface for the sake of simplification.

The illustration in FIG. 1 shows the combination of the two elements 1A, 2 described in such a manner that the transparent carrier 4, i.e., the substrate glass, and solar cell 1 take on, at the same time, the function of the first transparent carrier 9, which is called in professional terms also as a LCD cover glass. The optical planes of the photovoltaically active layer 6 and of the LCD 2 fall together in this structure. This means in concrete terms that the numerals of the LCD 2 appear in the same plane as the (data) window 3.

The above-described embodiment version of a solar dial face (solar cell 1) of a watch having an LCD can be manufactured as follows:

The solar cell 1 has to be initially manufactured since its necessary processing temperatures could damage the liquid crystal 11 and thereby the LCD 2 as well. The (data) window 3 is subsequently opened by forming an internal opening 8. Should only the metal of the second contact 7 and the photovoltaically active layer 6 be removed to form the opening 8, then the first transparent contact 5, i.e., the TCO layer, and the solar cell 1 can be constructed correspondingly and used to maintain contact with the fluid crystal 11 as shown in FIG. 1. However, it is also possible to remove part of the first contact 5 and apply in this area an additional TCO layer as a transparent contact 40 as shown in phantom lines in FIG. 1. The adhesive bond 17b with the second transparent carrier 10 is outside the viewable area, which is defined by the opening 8 in the photovoltaically active layer 6. Finally, the first polarizer 12 is applied on top of the solar cell 1 representing the solar dial face.

A second embodiment version of a solar dial face produces in a similar manner a watch having an LCD arranged according to the invention as shown in FIG. 4.

The basic elements in FIG. 4 are similar to the ones in the aforementioned embodiment example and they are a thin-film solar cell 1 and an LCD according to the state-of-the-art. The version illustrated in FIG. 4 differs from the above-described embodiment version only in the fact that not all three layers of the solar cell were removed to form the opening 8 in the area of the (data) window 3 of the solar cell 1 forming the solar dial face, whereby said three layers are namely the transparent first contact 5, the photovoltaically active layer 6 and the (metal) second contact 7. Instead, only the usually non-transparent (metal) contact 7 was removed. Should the photovoltaically active layer 6 be designed now to be semi-transparent, then there are created in this way new display possibilities and effects by stacking on top of one another the two optical elements, which are the solar cell 1 and the LCD 2.

The invention claimed is:

1. A solar-powered liquid crystal display device, comprising a solar structure including:
   an at least partially transparent first carrier,
   a solar cell arrangement carried by the first carrier and comprising, in stacked relationship:
      an at least partially transparent first contact,
      a photovoltaically active layer, and
      a second contact disposed on a side of the photovoltaically active layer opposite that of the first contact; and
   a liquid crystal display carried by the first carrier and comprising:
      a first polarizer,
      a liquid crystal layer,
      a transparent third contact disposed on a side of the liquid crystal opposite that of the first contact,
      a transparent second carrier,
      a second polarizer, and
      a reflector,
   wherein the solar cell arrangement includes an internal space formed therein, and the liquid crystal layer display is aligned with the internal space.

2. The device according to claim 1 wherein the liquid crystal layer display is disposed within the internal space.

3. The device according to claim 2 wherein the internal space extends through the photovoltaically active layer and the second contact.

4. The device according to claim 1 wherein the internal space extends through the second contact, and the liquid crystal display includes a transparent fourth contact disposed on the liquid crystal display and extending into the internal space.

5. The device according to claim 4 wherein the fourth contact is disposed between the liquid crystal display and the photovoltaically active layer.

6. The device according to claim 1 wherein the first carrier includes front and rear sides; and wherein the solar cell arrangement, the first contact, the liquid crystal layer, the second contact, the second carrier, the second polarizer, and the reflector are carried on the rear side of the first carrier, and the first polarizer is carried on the front side of the first carrier.

7. The device according to claim 1 wherein the first carrier comprises a timepiece dial face.

8. The device according to claim 1 wherein the first polarizer is seated on the first carrier.

* * * * *